(12) United States Patent
Nishida

(10) Patent No.: US 12,740,351 B2
(45) Date of Patent: Sep. 15, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventor: Keigo Nishida, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 619 days.

(21) Appl. No.: 18/112,896

(22) Filed: Feb. 22, 2023

(65) Prior Publication Data

US 2023/0215724 A1 Jul. 6, 2023

Related U.S. Application Data

(63) Continuation of application No. PCT/JP2020/035958, filed on Sep. 24, 2020.

(51) Int. Cl.

| | |
|---|---|
| ***H01L 21/02*** | (2006.01) |
| ***H10P 14/60*** | (2026.01) |
| ***H10P 14/69*** | (2026.01) |
| ***H10P 14/692*** | (2026.01) |
| ***H10P 14/694*** | (2026.01) |

(52) U.S. Cl.

CPC ...... *H10P 14/6309* (2026.01); *H10P 14/6905* (2026.01); *H10P 14/69215* (2026.01); *H10P 14/6927* (2026.01); *H10P 14/69433* (2026.01)

(58) Field of Classification Search

None

See application file for complete search history.

(56) References Cited

U.S. PATENT DOCUMENTS

| | | | |
|---|---|---|---|
| 2009/0170345 | A1 | 7/2009 | Akae et al. |
| 2011/0124204 | A1 | 5/2011 | Ota et al. |
| 2014/0220788 | A1 | 8/2014 | Sano et al. |
| 2017/0263439 | A1 | 9/2017 | Hashimoto et al. |
| 2017/0345645 | A1 | 11/2017 | Harada et al. |
| 2018/0033614 | A1 | 2/2018 | Chandra et al. |
| 2018/0204732 | A1 | 7/2018 | Kamakura et al. |

(Continued)

FOREIGN PATENT DOCUMENTS

| | | | |
|---|---|---|---|
| JP | 2004-006814 | A | 1/2004 |
| JP | 2010-050425 | A | 3/2010 |

(Continued)

OTHER PUBLICATIONS

Taiwanese Office Action dated Jul. 7, 2022 with English Translation.

(Continued)

*Primary Examiner* — Asok K Sarkar

(74) *Attorney, Agent, or Firm* — Volpe Koenig

(57) ABSTRACT

There is provided a technique that includes: (a) forming a first element-containing film on a substrate by supplying a first element-containing gas to the substrate in an oxygen-free atmosphere; and (b) forming an oxide film by oxidizing the first element-containing film by supplying an oxygen-containing gas to the substrate, wherein in (b), temperature of the substrate is selected depending on a thickness of the first element-containing film.

21 Claims, 8 Drawing Sheets

(56) References Cited

U.S. PATENT DOCUMENTS

| | | | |
|---|---|---|---|
| 2019/0080913 | A1 | 3/2019 | Ko et al. |
| 2019/0131126 | A1 | 5/2019 | Ko et al. |
| 2019/0214250 | A1 | 7/2019 | Horita et al. |

FOREIGN PATENT DOCUMENTS

| | | | | |
|---|---|---|---|---|
| JP | 2011-129879 | A | | 6/2011 |
| JP | 2014-154652 | A | | 8/2014 |
| JP | 2017-163078 | A1 | | 9/2017 |
| JP | 2019-054032 | A | | 4/2019 |
| JP | 2019-083271 | A | | 5/2019 |
| KR | 10-2005-0042707 | A | | 5/2005 |
| KR | 10-2017-0135693 | A | | 12/2017 |
| KR | 20230044931 | A | * | 4/2023 |
| TW | 202014546 | A | | 4/2020 |
| WO | 2017/046921 | A1 | | 3/2017 |
| WO | 2018/055674 | A1 | | 3/2018 |

OTHER PUBLICATIONS

International Search Report and English Translation, PCT/JP2020/035958, Dec. 22, 2020.

Korean Office Action issued on Jun. 25, 2024 for Korean Patent Application No. 10-2023-7005874.

Extended European Search Report issued on May 10, 2024 for European Patent Application No. 20955180.3.

* cited by examiner

FIG. 2

SiN film formation
SiO film formation
1st cycle
2nd cycle
nth cycle
First element-containing gas
Nitrogen-containing gas
Inert gas
Oxygen-containing gas
Hydrogen-containing gas
Processing temperature

200

SiN
200

SiO
200

200

Si
200

SiO
200

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2020/035958, filed Sep. 24, 2020, the disclosure of which is incorporated herein in its entirety by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a film-forming process of forming a film on a substrate and oxidizing this film to form an oxide film may be carried out.

SUMMARY

Some embodiments of the present disclosure provides a technique of enhancing an effect of suppressing oxidation of a base when forming an oxide film on the base.

According to some embodiments of the present disclosure, there is provided a technique that includes: (a) forming a first element-containing film on a substrate by supplying a first element-containing gas to the substrate in an oxygen-free atmosphere; and (b) forming an oxide film by oxidizing the first element-containing film by supplying an oxygen-containing gas to the substrate, wherein in (b), temperature of the substrate is selected depending on a thickness of the first element-containing film.

BRIEF DESCRIPTION OF DRAWINGS

The accompanying drawings, which are incorporated in and constitute a portion of the specification, illustrate embodiments of the present disclosure.

FIG. 2 is a schematic structure view of the vertical process furnace of the substrate processing apparatus suitably used in some embodiments of the present disclosure, in which a portion of the process furnace is shown in a cross section taken along line A-A in FIG. 1.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Embodiments of the Present Disclosure

Embodiments of the present disclosure will now be described mainly with reference to FIGS. 1 to 4 and 5A to 5C. The drawings used in the following description are schematic, and dimensional relationships, ratios, and the like of the respective components shown in drawings may not match actual ones. Further, dimensional relationships, ratios, and the like of the respective components among plural drawings may not match each other.

(1) Structure of Substrate Processing Apparatus

Figure 1:
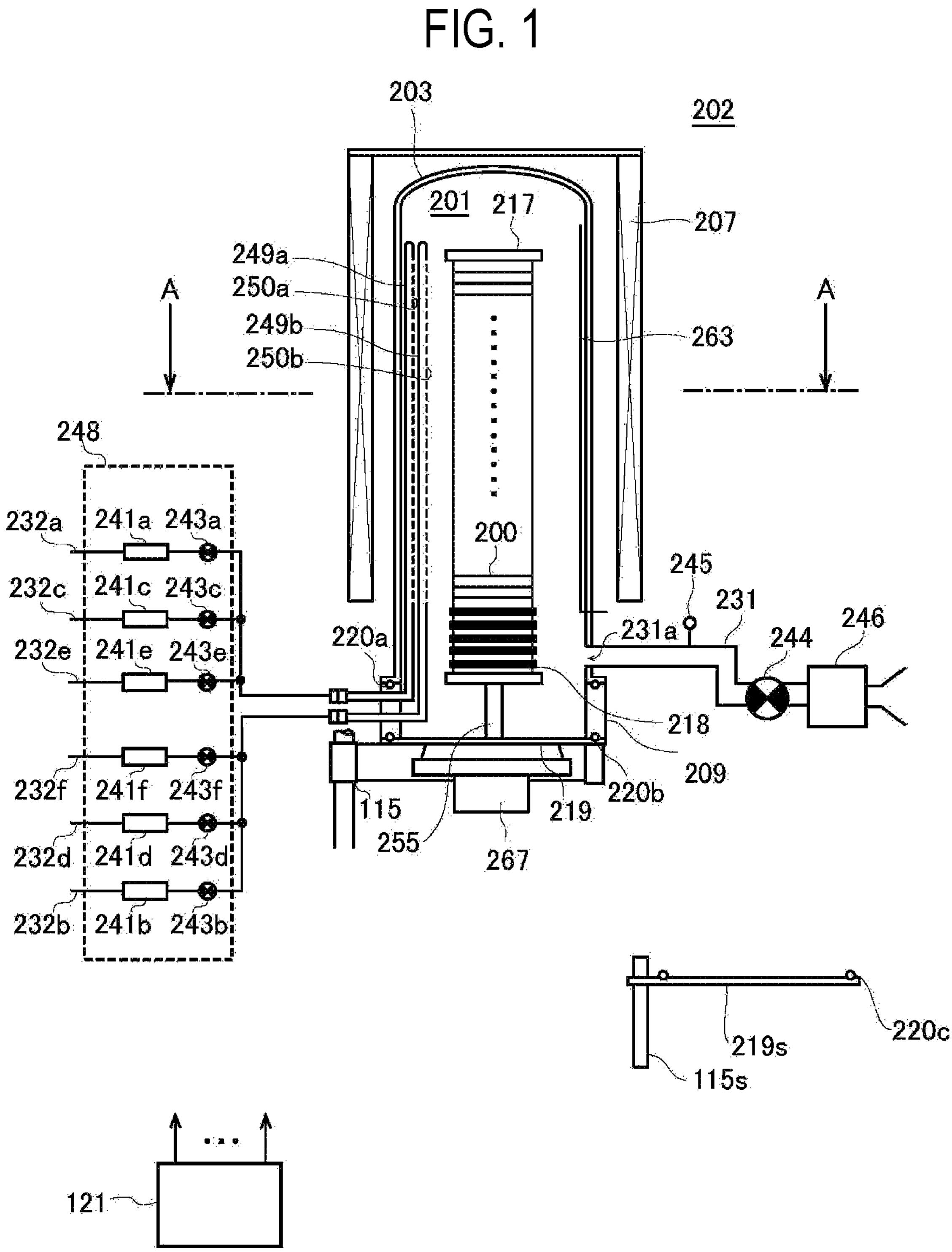
FIG. 1 is a schematic structure view of a vertical process furnace of a substrate processing apparatus suitably used in some embodiments of the present disclosure, in which a portion of the process furnace is shown in a vertical cross section.

As shown in FIG. 1, a process furnace 202 includes a heater 207 as a temperature regulator (a heating part). The heater 207 is formed in a cylindrical shape and is supported by a holding plate to be vertically installed. The heater 207 functions as an activator (an exciter) when a gas is thermally activated (excited).

A reaction tube 203 is disposed inside the heater 207 to be concentric with the heater 207. The reaction tube 203 is made of, for example, heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, metal material such as stainless steel (SUS), and is formed in a cylindrical shape with both of its upper and lower ends opened. The upper end of the manifold 209 engages with the lower end of the reaction tube 203 to support the reaction tube 203. An O-ring 220*a* serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical area of the process container. The process chamber 201 is configured to be capable of accommodating wafers 200 as substrates. The wafers 200 are processed in the process chamber 201.

Nozzles 249*a* and 249*b* as first and second suppliers are installed in the process chamber 201 to penetrate a sidewall of the manifold 209. The nozzles 249*a* and 249*b* are also referred to as first and second nozzles, respectively. The nozzles 249*a* and 249*b* are made of, for example, heat resistant material such as quartz or SiC. Gas supply pipes 232*a* and 232*b* are connected to the nozzles 249*a* and 249*b*, respectively.

Mass flow controllers (MFCs) 241*a* and 241*b*, which are flow rate controllers (flow rate control parts), and valves 243*a* and 243*b*, which are opening/closing valves, are installed at the gas supply pipes 232*a* and 232*b*, respectively, sequentially from the upstream side of a gas flow. Each of gas supply pipes 232*c* and 232*e* is connected to the gas supply pipe 232*a* at the downstream side of the valves 243*a*. Each of gas supply pipes 232*d* and 232*f* is connected to the gas supply pipe 232*b* at the downstream side of the valves 243*b*. MFCs 241*c* to 241*f* and valves 243*c* to 243*f* are installed at the gas supply pipes 232*c* to 232*f*, respectively, sequentially from the upstream side of a gas flow. The gas supply pipes 232*a* to 232*f* are made of, for example, metal material such as SUS.

Figure 2:
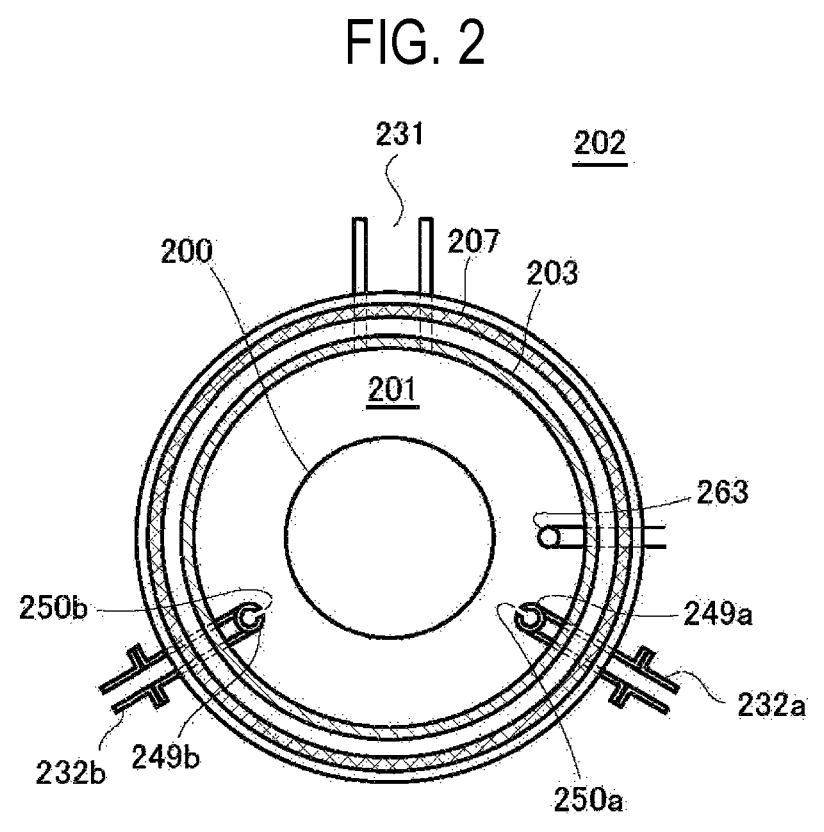

As shown in FIG. 2, each of the nozzles 249*a* and 249*b* is installed in an annular space in a plane view between an inner wall of the reaction tube 203 and the wafers 200 to extend upward from a lower side to an upper side of the inner wall of the reaction tube 203, that is, along an arrangement direction of the wafers 200. Specifically, each of the nozzles 249*a* and 249*b* is installed at a region horizontally surrounding a wafer arrangement region in which the wafers 200 are arranged at a lateral side of the wafer arrangement region, along the wafer arrangement region. Gas supply holes 250*a* and 250*b* configured to supply a gas are formed on the side surfaces of the nozzles 249*a* and 249*b*, respectively. Each of the gas supply holes 250*a* and 250*b* is opened to face the center of the reaction tube 203, which enables a gas to be supplied toward the wafers 200. A plurality of gas supply holes 250*a* and 250*b* are formed from the lower side to the upper side of the reaction tube 203.

A gas containing a first element constituting a film formed on a wafer 200, that is, a first element-containing gas, is supplied from the gas supply pipe 232*a* into the process chamber 201 via the MFC 241*a*, the valve 243*a*, and the nozzle 249*a*.

A nitrogen (N)-containing gas as a nitriding gas is supplied from the gas supply pipe 232*b* into the process chamber 201 via the MFC 241*b*, the valve 243*b*, and the nozzle 249*b*.

A hydrogen (H)-containing gas is supplied from the gas supply pipe 232*c* into the process chamber 201 via the MFC 241*c*, the valve 243*c*, the gas supply pipe 232*a*, and the nozzle 249*a*. The H-containing gas alone does not achieve an oxidizing action, but under certain conditions, it reacts with an oxygen (O)-containing gas to generate oxidizing species such as atomic oxygen (O), which acts to improve an efficiency of an oxidizing process.

An O-containing gas is supplied from the gas supply pipe 232*d* into the process chamber 201 via the MFC 241*d*, the valve 243*d*, the gas supply pipe 232*b*, and the nozzle 249*b*.

An inert gas is supplied from the gas supply pipes 232*e* and 232*f* into the process chamber 201 via the MFCs 241*e* and 241*f*, the valves 243*e* and 243*f*, the gas supply pipes 232*a* and 232*b*, and the nozzles 249*a* and 249*b*, respectively. The inert gas acts as a purge gas, a carrier gas, a dilution gas, or the like.

A silane-based gas supply system as a first gas supply system (first gas supplier) mainly includes the gas supply pipe 232*a*, the MFC 241*a*, and the valve 243*a*. A N-containing gas supply system mainly includes the gas supply pipe 232*b*, the MFC 241*b*, and the valve 243*b*. An O-containing gas supply system as a second gas supply system (second gas supplier) mainly includes the gas supply pipe 232*d*, the MFC 241*d*, and the valve 243*d*. A H-containing gas supply system mainly includes the gas supply pipe 232*c*, the MFC 241*c*, and the valve 243*c*. An inert gas supply system mainly includes the gas supply pipes 232*e* and 232*f*, the MFCs 241*e* and 241*f*, and the valves 243*e* and 243*f*.

One or the entirety of the above-described various supply systems may be constituted as an integrated-type supply system 248 in which the valves 243*a* to 243*f*, the MFCs 241*a* to 241*f*, and so on are integrated. The integrated-type supply system 248 is connected to each of the gas supply pipes 232*a* to 232*f*. In addition, the integrated-type supply system 248 is configured such that operations of supplying various gases into the gas supply pipes 232*a* to 232*f*, that is, the opening/closing operation of the valves 243*a* to 243*f*, the flow rate regulation operation by the MFCs 241*a* to 241*f*, and the like, are controlled by a controller 121 which is described below. The integrated-type supply system 248 is constituted as an integral type or detachable-type integrated unit, and may be attached to or detached from the gas supply pipes 232*a* to 232*f* and the like on an integrated unit basis, such that maintenance, replacement, extension, and the like of the integrated-type supply system 248 may be performed on an integrated unit basis.

An exhaust port 231*a* configured to exhaust an internal atmosphere of the process chamber 201 is installed below the sidewall of the reaction tube 203. The exhaust port 231*a* may be installed from a lower side to an upper side of the sidewall of the reaction tube 203, that is, along the wafer arrangement region. An exhaust pipe 231 is connected to the exhaust port 231*a*. A vacuum pump 246 as a vacuum exhauster is connected to the exhaust pipe 231 via a pressure sensor 245, which is a pressure detector (pressure detection part) configured to detect an internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is installed under the manifold 209. The seal cap 219 is made of, for example, metal material such as SUS, and is formed in a disc shape. An O-ring 220*b*, which is a seal making contact with the lower end of the manifold 209, is installed at an upper surface of the seal cap 219. A rotator 267 configured to rotate a boat 217, which is described below, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is configured as a transfer apparatus (transfer mechanism) which loads or unloads (transfers) the wafers 200 into or out of the process chamber 201 by moving the seal cap 219 up or down.

A shutter 219*s*, which serves as a furnace opening lid configured to be capable of hermetically sealing a lower end opening of the manifold 209 in a state where the seal cap 219 is lowered and the boat 217 is unloaded from the process chamber 201, is installed under the manifold 209. The shutter 219*s* is made of, for example, metal material such as SUS, and is formed in a disc shape. An O-ring 220*c*, which is a seal making contact with the lower end of the manifold 209, is installed at an upper surface of the shutter 219*s*. The opening/closing operation (such as elevation operation, rotation operation, or the like) of the shutter 219*s* is controlled by a shutter opening/closing mechanism 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, heat resistant material such as quartz or SiC. Heat insulating plates 218 made of, for example, heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution inside the process chamber 201 becomes a desired temperature distribution. The temperature sensor 263 is installed along the inner wall of the reaction tube 203.

Figure 3:
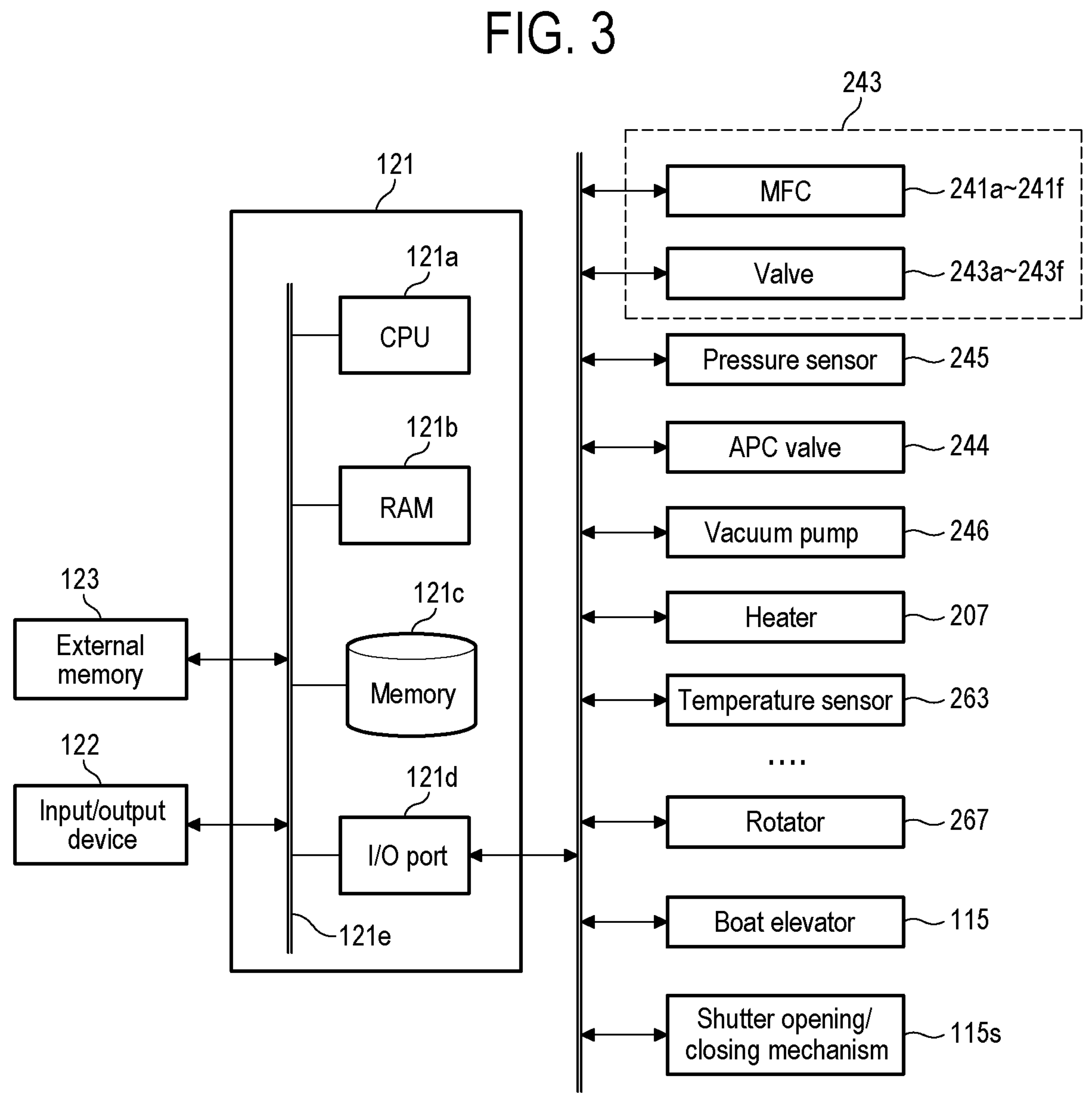
FIG. 3 is a schematic structure diagram of a controller of the substrate processing apparatus suitably used in some embodiments of the present disclosure, in which a control system of the controller 121 is shown in a block diagram.
Figure 4:
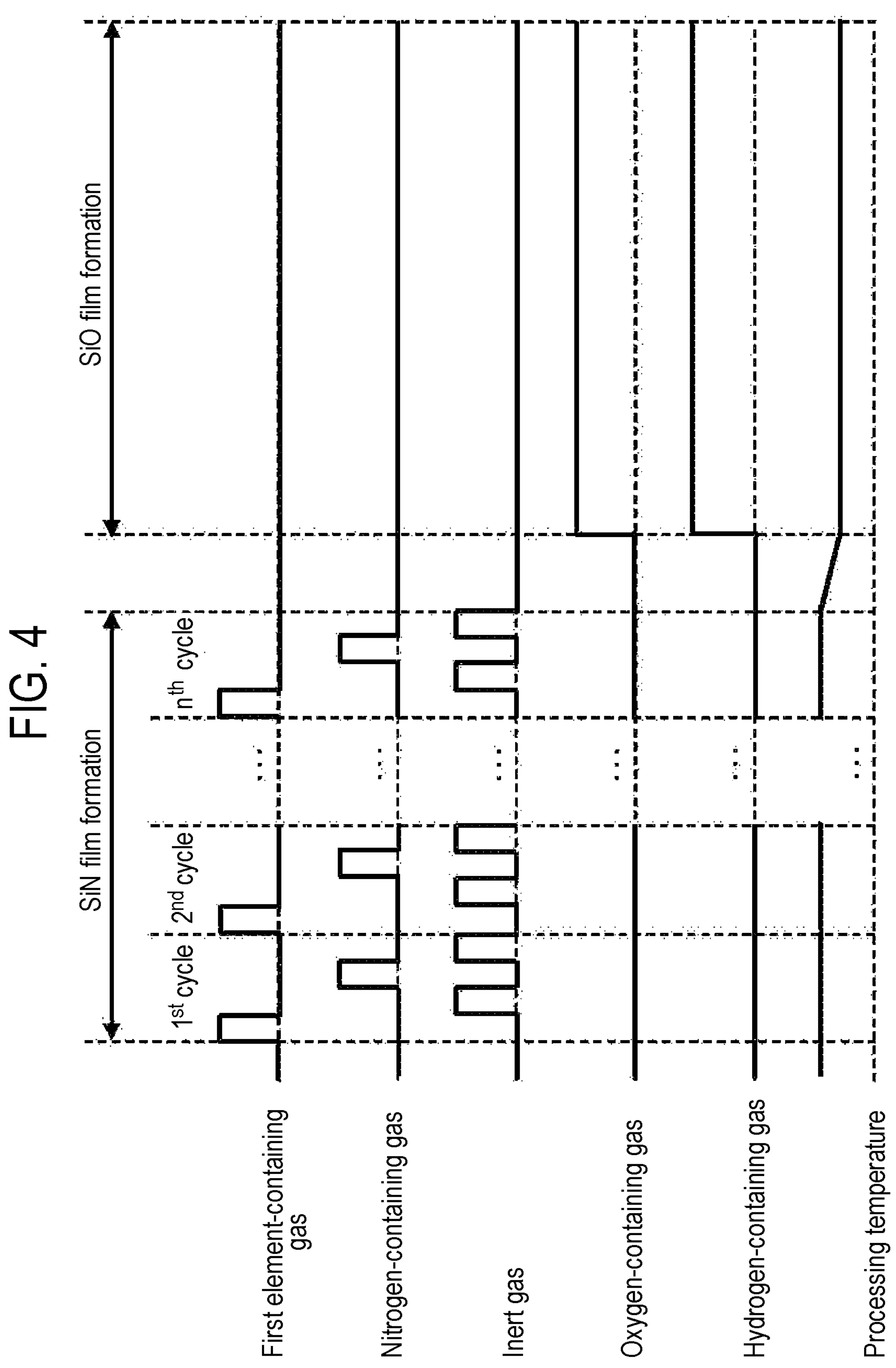
FIG. 4 is a diagram showing an example of gas supply timing and processing temperature in a film-forming process of some embodiments of the present disclosure.

As shown in FIG. 3, a controller 121, which is a control part (control means or unit), is constituted as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 including, e.g., a touch panel or the like, is connected to the controller 121.

The memory 121*c* includes, for example, a flash memory, a hard disk drive (HDD), a solid state drive (SSD), or the like. A control program that controls operations of a substrate processing apparatus, a process recipe in which sequences and conditions of substrate processing to be described below are written, and the like are readably stored in the memory 121*c*. The process recipe functions as a program that causes the controller 121 to perform each sequence in the substrate processing, which is described below, to obtain an expected result. Hereinafter, the process recipe and the control program may be generally and simply referred to as a "program." Further, the process recipe may be simply referred to as a "recipe." When the term "program" is used herein, it may indicate a case of including the recipe, a case of including the control program, or a case of including both the recipe and the control program. The RAM 121*b* is constituted as a memory area (work area) in which programs or data read by the CPU 121*a* are temporarily stored.

The I/O port 121*d* is connected to the MFCs 241*a* to 241*f*, the valves 243*a* to 243*f*, the pressure sensor 245, the APC valve 244, the vacuum pump 246, the temperature sensor 263, the heater 207, the rotator 267, the boat elevator 115, the shutter opening/closing mechanism 115*s*, and so on.

The CPU 121*a* is configured to read and execute the control program from the memory 121*c*. The CPU 121*a* is also configured to be capable of reading the recipe from the memory 121*c* according to an input of an operation command from the input/output device 122. The CPU 121*a* is configured to be capable of controlling the flow rate regulating operation of various kinds of gases by the MFC s 241*a* to 241*h*, the opening/closing operation of the valves 243*a* to 243*h*, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting a rotation speed of the boat 217, the operation of moving the boat 217 up or down by the boat elevator 115, the opening/closing operation of the shutter 219*s* by the shutter opening/closing mechanism 115*s*, and so on, according to contents of the read recipe.

The controller 121 may be constituted by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory or a SSD, and the like. The memory 121*c* or the external memory 123 is constituted as a computer-readable recording medium. Hereinafter, the memory 121*c* and the external memory 123 may be generally and simply referred to as a "recording medium." When the term "recording medium" is used herein, it may indicate a case of including the memory 121*c*, a case of including the external memory 123, or a case of including both the memory 121*c* and the external memory 123. Furthermore, the program may be provided to the computer by using communication means or unit such as the Internet or a dedicated line, instead of using the external memory 123.

(2) Substrate Processing Process

As a process of manufacturing a semiconductor device by using the above-described substrate processing apparatus, an example of a film formation process sequence when forming an oxide film with a predetermined film thickness on a wafer 200 as a substrate will be described mainly with reference to FIGS. 4 and 5A to 5C. Further, in the embodiments of the present disclosure, the wafer 200 with no oxygen film on its surface is used. In the following descriptions, the operations of the respective components constituting the substrate processing apparatus are controlled by the controller 121.

A film formation processing sequence in the embodiments of the present disclosure includes:

step (a) of forming a first element-containing film on a wafer 200 in a process chamber by supplying a first element-containing gas to the wafer 200 in an oxygen-free atmosphere; and step (b) of forming an oxide film by oxidizing the first element-containing film by supplying an oxygen-containing gas to the wafer 200, wherein in step (b), different temperatures of the wafer 200 are selected depending on the thickness of the first element-containing film.

As an example, in the film formation processing sequence in the embodiments of the present disclosure, in step (a), a first element-containing nitride film (hereinafter, sometimes simply referred to as a nitride film) is formed as the first element-containing film by performing a cycle a predetermined number of times (n times, where n is an integer of 1 or more), the cycle including non-simultaneously performing a step of supplying the first element-containing gas to the wafer 200 and a step of supplying a N-containing gas as a nitriding gas to the wafer 200.

Further, as an example, in the film formation processing sequence in the embodiments of the present disclosure, in step (b), a first element-containing oxide film (hereinafter, sometimes simply referred to as an oxide film) is formed by oxidizing the first element-containing nitride film by simultaneously supplying an O-containing gas and a H-containing gas to the wafer 200 in the process chamber 201 under a reduced pressure (under a pressure less than the atmospheric pressure).

Further, the surface of the wafer 200 on which the film-forming process is performed in the embodiments of the present disclosure is constituted by a substantially non-oxidized base (an oxygen-free base). That is, an oxygen-free layer or film is formed as a base on the surface of the wafer 200. In the embodiments of the present disclosure, as the oxygen-free base, for example, a film composed of an element such as silicon (Si), aluminum (Al), hafnium (Hf), zirconium (Zr), or titanium (Ti), a nitride film, a carbide film, and the like containing those elements are exemplified, but the present disclosure is not limited thereto as long as a composition of the film is an oxygen-free composition.

In the present disclosure, for the sake of convenience, the above-described film formation processing sequence may be denoted as follows. The same denotation may be used in other embodiments to be described below.

(First element-containing gas→N-containing gas)×
*n*→(O-containing gas+H-containing gas)

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

After the boat 217 is charged with a plurality of wafers 200 (wafer charging), the shutter **219*s* is moved by the shutter opening/closing mechanism 115*s* and the lower end opening of the manifold 209 is opened (shutter open). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220*b***.

(Pressure Regulation and Temperature Regulation)

After the boat loading is completed, a side of the process chamber 201, that is, a space where the wafers 200 are placed, is vacuum-exhausted (decompression-exhausted) by the vacuum pump 246 to reach a desired pressure (state of vacuum). In this operation, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to a desired processing temperature. At this time, a state of supplying electric power to the heater 207 is feedback-controlled based on the temperature information detected by the temperature sensor 263 such that a temperature distribution inside the process chamber 201 becomes a desired temperature distribution (temperature regulation). Further, the rotation of the wafers 200 by the rotator 267 is started. The exhaust of the inside of the process chamber 201 and the heating and rotation of the wafers 200 are continuously performed at least until the processing on the wafers 200 is completed.

(Formation of First Element-Containing Nitride Film)

Thereafter, the following steps 1 and 2 are executed sequentially.

[Step 1]

In step 1, a first element-containing gas is supplied to a wafer 200 in the process chamber 201.

Specifically, the valve **243*a* is opened to allow the first element-containing gas to flow into the gas supply pipe 232*a*. The flow rate of the first element-containing gas is regulated by the MFC 241*a*, and the first element-containing gas is supplied into the process chamber 201 via the nozzle 249*a* and is exhausted via the exhaust port 231*a*. In this operation, the first element-containing gas is supplied to the wafer 200 (first element-containing gas supply). At this time, the valves 243*e* and 243*f* may be opened to allow an inert gas to be supplied into the process chamber 201 via the nozzles 249*a* and 249*b*, respectively. Thus, in this step, the wafer 200 is processed in an oxygen-free atmosphere without supplying an O-containing gas into the process chamber 201**.

A process condition in this step is exemplified as follows.

First element-containing gas supply flow rate: 1 to 2,000 sccm, specifically 10 to 1,000 sccm Inert gas supply flow rate (for each gas supply pipe): 100 to 2,000 slm Each gas supply time: 1 to 120 seconds, specifically 1 to 60 seconds Processing temperature (temperature of wafer 200): 350 to 800 degrees C., specifically 450 to 800 degrees C.

Processing pressure (internal pressure of process chamber 201): 1 to 13,300 Pa, specifically 10 to 1,330 Pa In the present disclosure, notation of a numerical range such as "10 to 1,330 Pa" means that the lower limit value and the upper limit value are included in the range. Therefore, for example, "10 to 1,330 Pa" means "10 Pa or higher and 1,330 Pa or lower." The same applies to other numerical ranges.

For example, when a chlorosilane-based gas, which is a Si-containing gas described below, is used as the first element-containing gas, by supplying the chlorosilane-based gas to the wafer 200 under the above-mentioned condition, a Si-containing layer as a first element-containing layer containing chlorine (Cl) with a predetermined thickness is formed as a first layer on the outermost surface of the wafer 200 as a base. The Si-containing layer containing Cl is formed by physical adsorption or chemical adsorption of molecules of the chlorosilane-based gas, chemical adsorption of molecules of substance obtained by partially decomposing the chlorosilane-based gas, deposition of Si by thermal decomposition of the chlorosilane-based gas, and the like on the outermost surface of the wafer 200. The Si-containing layer containing Cl may be an adsorption layer (physical adsorption layer or chemical adsorption layer) of molecules of the chlorosilane-based gas or molecules of substance obtained by partially decomposing the chlorosilane-based gas, or a Si deposition layer containing Cl. When the above-mentioned chemical adsorption layer or the above-mentioned deposition layer is formed on the outermost surface of the wafer 200, Si contained in the chlorosilane-based gas is adsorbed on the outermost surface of the wafer 200. In the present disclosure, the Si-containing layer containing Cl is also simply referred to as a Si-containing layer.

After the Si-containing layer is formed, the valve 243*a* is closed to stop the supply of the first element-containing gas into the process chamber 201. Then, the inside of the process chamber 201 is vacuum-exhausted to remove a gas and the like remaining in the process chamber 201 from the process chamber 201 (purging). At this time, with the valves 243*e* and 243*f* left open, an inert gas is supplied into the process chamber 201. The inert gas acts as a purge gas.

As the first element-containing gas, for example, a silane-based gas containing Si as a first element may be used. As the silane-based gas, for example, a gas containing Si and a halogen, that is, a halosilane gas, may be used. The halogen may be chlorine (Cl), fluorine (F), bromine (Br), iodine (I), or the like. As the halosilane gas, for example, a chlorosilane gas containing Si and Cl may be used.

More specifically, examples of the first element-containing gas may include chlorosilane-base gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, and an octachlorotrisilane ($Si_3Cl_8$, abbreviation: OCTS) gas, which contain Si as the first element. Further, examples of the first element-containing gas may include fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas, which contain Si as the first element. Further, examples of the first element-containing gas may include aminosilane-based gases such as a tetrakis (dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, and a bis(tert-butylamino)silane ($SiH_2[NH(C_4H_9)]_2$, abbreviation: BTBAS) gas, which contain Si as the first element. One or more selected from the group of these gases may be used as the first element-containing gas.

As the inert gas, for example, a nitrogen ($N_2$) gas may be used, and in addition, rare gases such as an argon (Ar) gas, a helium (He) gas, a neon (Ne) gas, and a xenon (Xe) gas may be used. One or more selected from the group of these gases may be used as the inert gas. The same applies each step described below.

[Step 2]

After step 1 is completed, a N-containing gas is supplied to the wafer 200 in the process chamber 201, that is, the Si-containing layer (the first element-containing layer) formed as the first layer on the wafer 200.

Specifically, the valve 243*b* is opened to allow the N-containing gas to flow through the gas supply pipe 232*b*. A flow rate of the N-containing gas is regulated by the MFC 241*b*, and the N-containing gas is supplied into the process chamber 201 via the nozzle 249*b* and is exhausted via the exhaust port 231*a*. In this operation, the N-containing gas is supplied to the wafer 200 (N-containing gas supply). At this time, the valves 243*e* and 243*f* may be opened to allow an inert gas to be supplied into the process chamber 201 via the nozzles 249*a* and 249*b*. Thus, in this step as well, the wafer 200 is processed in an oxygen-free atmosphere without supplying an O-containing gas into the process chamber 201.

A process condition in this step is exemplified as follows.

N-containing gas supply flow rate: 100 to 10,000 sccm

N-containing gas supply time: 1 to 120 seconds

Processing pressure (internal pressure of process chamber 201): 100 to 13,300 Pa, specifically 500 to 3,000 Pa Other process conditions are the same as those in step 1.

By supplying the N-containing gas as a nitriding gas to the wafer 200 under the above-mentioned condition, at least a portion of the Si-containing layer formed on the wafer 200 is nitrided (modified). As a result, as a first element-containing nitride layer, that is, a layer containing Si and N, a silicon nitride layer (SiN layer) is formed as a second layer on the outermost surface of the wafer 200 as the base. Impurities such as Cl contained in the Si-containing layer when forming the SiN layer form a gaseous substance containing at least Cl in the process of a modifying reaction of the Si-containing layer by the N-containing gas and are discharged from the inside of the process chamber 201. As a result, the SiN layer becomes a layer containing fewer impurities such as Cl than the Si-containing layer formed in step 1.

After the SiN layer as the second layer is formed, the valve 243*b* is closed to stop the supply of the N-containing gas into the process chamber 201. Then, a gas and the like remaining in the process chamber 201 is removed from the process chamber 201 (purging) according to the same processing procedure as the purging in step 1.

As the N-containing gas which is the nitriding gas (nitriding agent), for example, a gas containing N and H may be used. The N- and H-containing gas may contain a N—H bond. As the nitriding gas containing the N—H bond, for example, hydrogen nitride-based gases such as an ammonia ($NH_3$) gas, a diazene ($N_2H_2$) gas, a hydrazine ($N_2H_4$) gas, and a $N_3H_8$ gas may be used. One or more selected from the group of these gases may be used as the nitriding gas.

Further, as the N-containing gas which is the nitriding gas, for example, nitrogen (N)-, carbon (C)- and hydrogen (H)-containing gas may be used. As the N-, C- and H-containing gas, for example, an amine-based gas and an organic hydrazine-based gas may be used. The N-, C- and H-containing gas is a N-containing gas, a C-containing gas, a H-containing gas, and also a N- and C-containing gas.

More specifically, examples of the N-, C- and H-containing gas may include ethylamine-based gases such as a monoethylamine ($C_2H_5NH_2$, abbreviation: MEA) gas, a diethylamine ($(C_2H_5)_2NH$, abbreviation: DEA) gas, and a triethylamine ($(C_2H_5)_3N$, abbreviation: TEA) gas, methylamine-based gases such as a monomethylamine ($CH_3NH_2$, abbreviation: MMA) gas, a dimethylamine ($(CH_3)_2NH$, abbreviation: DMA) gas, and a trimethylamine ($(CH_3)_3N$, abbreviation: TMA) gas, organic hydrazine-based gases such as a monomethylhydrazine ($(CH_3)HN_2H_2$, abbreviation: MMH) gas, a dimethylhydrazine ($(CH_3)_2N_2H_2$, abbreviation: DMH) gas, and a trimethylhydrazine ($(CH_3)_2N_2(CH_3)H$, abbreviation: TMH) gas, and the like. One or more selected from the group of these gases may be used as the N-, C- and H-containing gas.

[Performing Cycle Predetermined Number of Times]

Figures 5A, 5B, 5C:
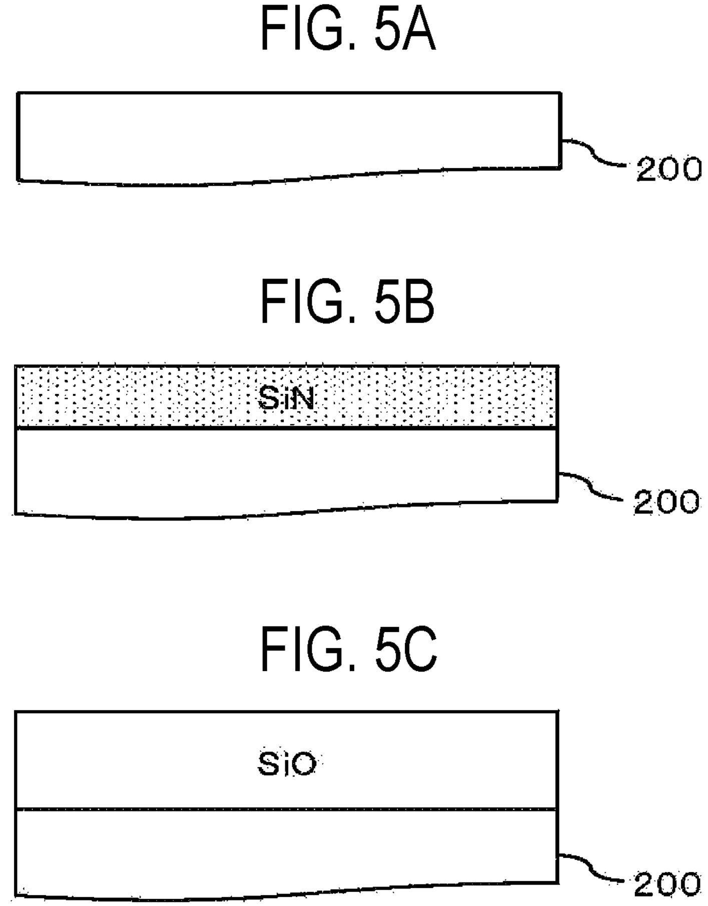
FIG. 5A is a partially enlarged cross-sectional view of a surface of a wafer before the film-forming process is performed.
FIG. 5B is a partially enlarged cross-sectional view of the surface of the wafer after a nitride film as a first element-containing film is formed on the wafer.
FIG. 5C is a partially enlarged cross-sectional view of the surface of the wafer after the nitride film formed on the wafer is oxidized to form an oxide film.
Figure 6:
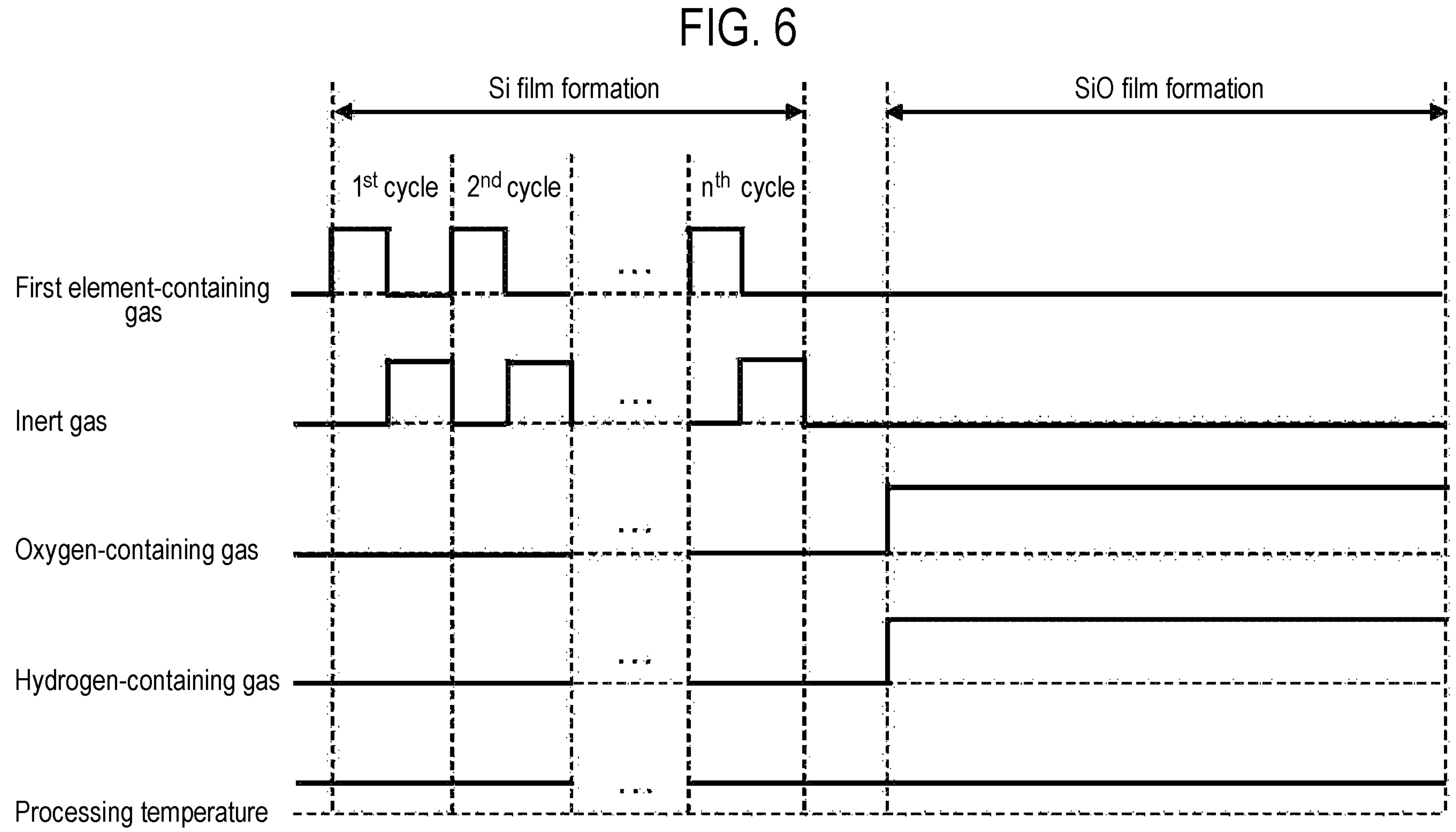
FIG. 6 is a diagram showing an example of gas supply timing and processing temperature in a film-forming process of other embodiments of the present disclosure.

By performing a cycle a predetermined number of times (n times, where n is an integer of 1 or more), the cycle including non-simultaneously, that is, without synchronization, performing the above-described step 1 and step 2, a SiN film as a first element-containing nitride film with a predetermined thickness may be formed on the surface of the wafer 200 as the base, as shown in FIG. 5B. The above-described cycle may be performed a plurality of times. That is, a thickness of the SiN layer formed per cycle may be set to be smaller than a desired film thickness, and the above-described cycle may be performed a plurality of times until the thickness of the SiN film formed by stacking SiN layers reaches a desired thickness. Further, the SiN film as the first element-containing nitride film formed in step (a) expands at a predetermined rate by being oxidized in step (b) described below, to be converted into a SiO film as a first element-containing oxide film. In step (a), considering this fact, that is, an expansion rate of the SiN film, the film thickness of the SiN film may be determined by calculating back from the target film thickness of the SiO film to be formed in step (b).

(Pressure Regulation and Temperature Regulation)

After the process of forming the SiN film with the desired thickness on the wafer 200 is completed, the APC valve 244 is regulated such that the internal pressure of the process chamber 201 becomes a predetermined pressure lower than the atmospheric pressure (pressure regulation). Further, the output of the heater 207 is regulated such that the temperature of the wafer 200 in the process chamber 201 becomes a predetermined temperature (temperature regulation).

(Formation of First Element-Containing Oxide Film)

Thereafter, an O-containing gas and a H-containing gas as oxidizing gases are supplied to the wafer 200 in the process chamber 201, that is, the SiN film as the first element-containing nitride film formed on the wafer 200.

Specifically, the valve 243*d* is opened to allow the O-containing gas to flow through the gas supply pipe 232*d*. A flow rate of the O-containing gas flowing through the gas supply pipe 232*d* is regulated by the MFC 241*d*, and the O-containing gas is supplied into the process chamber 201 via the nozzle 249*b*. At the same time, the valve 243*c* is opened to allow the H-containing gas to flow through the gas supply pipe 232*c*. A flow rate of the H-containing gas flowing through the gas supply pipe 232*c* is regulated by the MFC 241*c*, and the H-containing gas is supplied into the process chamber 201 via the nozzle 249*a*. The O-containing gas and the H-containing gas are mixed and react to each other in the process chamber 201 and then are exhausted via the exhaust port 231*a*. At this time, moisture ($H_2O$)-free oxidizing species containing oxygen such as atomic oxygen generated by a reaction between the O-containing gas and the H-containing gas are supplied to the wafer 200 (O-containing gas+H-containing gas supply). At this time, the valves 243*e* and 243*f* may be opened to allow an inert gas to be supplied into the process chamber 201 via the nozzles 249*a* and 249*b*.

A process condition in this step is exemplified as follows.

O-containing gas supply flow rate: 1,000 to 30,000 sccm

H-containing gas supply flow rate: 1,000 to 10,000 sccm

Each gas supply time: 1 to 1,000 minutes, specifically 1 to 300 minutes

Processing temperature (temperature of wafer 200): 300 degrees C. or higher, and lower than 800 degrees C., specifically 300 degrees C. or higher, and lower than 600 degrees C.

Processing pressure (internal pressure of process chamber 201): 1 Pa or higher and lower than the atmospheric pressure, specifically 1 to 1,000 Pa Other process conditions are the same as those in step 1.

By supplying the O-containing gas and the H-containing gas to the wafer 200 under the above-mentioned condition, it is possible to introduce O into the SiN film formed on the wafer 200 by oxidizing the SiN film by using a strong oxidizing power of the oxidizing species such as atomic oxygen. Further, it is possible to desorb N contained in the SiN film from the film. As a result, as shown in FIG. 5C, it is possible to convert the SiN film as the first element-containing nitride film formed on the wafer 200 into the SiO film as the first element-containing oxide film.

Further, when the SiN film is oxidized to be converted into the SiO film under the above-mentioned condition, the SiN film expands at a predetermined rate (expansion rate) by introducing O in the process of oxidation. Therefore, the SiO film formed by performing step (b) becomes a film with a larger film thickness than the SiN film before the oxidation process (the SiN film formed by performing step (a)). For example, when the thickness of the SiN film formed by performing step (a) is 5 to 500 Å, the thickness of the SiO film formed by performing step (b) under the above-mentioned process condition becomes a thickness multiplied by its expansion ratio (about 1.6), that is, a thickness of about 8 to 800 Å.

In this step, as the processing temperature, a different processing temperature (temperature of the wafer 200) is selected depending on the thickness of the SiN film formed in step (a).

For example, in this step, as the processing temperature, a temperature at which the entirety of the SiN film in a thickness direction of the SiN film is oxidized is selected depending on the thickness of the SiN film. By selecting such a temperature in this step, it is possible to oxidize the entirety of the SiN film formed in step (a) in its thickness direction to be converted into the SiO film.

Further, for example, in this step, as the processing temperature, a temperature at which the entirety of the SiN film in the thickness direction of the SiN film is oxidized and an interface between the wafer 200 and the SiN film (that is, the surface of the wafer 200 as the base on which the SiN film is formed) is not oxidized is selected depending on the thickness of the SiN film. By selecting such a temperature in this step, it is possible to suppress oxidation of the surface of the wafer 200, which is the base, while oxidizing the entirety of the SiN film formed in step (a) in its thickness direction to be converted into the SiO film.

Further, for example, in this step, as the processing temperature, a temperature at which the oxidation reaction is saturated when the entirety of the SiN film in its thickness direction is oxidized is selected depending on the thickness of the SiN film. By selecting such a temperature in this step and continuing this step until the oxidation reaction of the entirety of the SiN film is saturated, it is possible to oxidize the entirety of the SiN film formed in step (a) in its thickness direction to be converted into the SiO film. Further, by selecting such a temperature in this step, the oxidation reaction may be saturated when the entirety of the SiN film in its thickness direction is oxidized, and thereafter, even in a case where a processing time is exceeded, it is possible to suppress oxidation of the surface of the wafer 200. That is, by selecting such a temperature in this step, it is possible to easily achieve the process of oxidizing the entirety of the SiN film without strictly controlling the processing time while suppressing oxidation of the surface of the wafer 200.

The term "saturation of the oxidation reaction" as used herein refers to a state in which a rate at which a thickness of the oxide film increases per unit time gradually decreases to OA/min or approaches OA/min. However, in the present disclosure, the phrase "the oxidation reaction is saturated" is not limited to a case where the rate at which the thickness of the oxide film increases per unit time is OA/min. A case where the rate at which the thickness of the oxide film increases per unit time is 0.4 Å/min or less, specifically 0.2 Å/min or less, may be also included in "the oxidation reaction is saturated." It may take a very long time for the rate of increase to substantively converge to OA/min, and in this case, from a practical point of view, when a processing temperature is selected at which the rate of increase is 0.4 Å/min or less when the entirety of the SiN film in its thickness direction is oxidized, the above-described effect (that is, the effect that it is possible to easily achieve the process of oxidizing the entirety of the SiN film without strictly controlling the processing time while suppressing oxidation of the surface of the wafer 200) can be obtained. Further, in a case where a processing temperature is selected at which the rate of increase is 0.2 Å/min or less when the entirety of the SiN film in its thickness direction is oxidized, it is possible to more accurately (with high controllability) perform the process of oxidizing the entirety of the SiN film while suppressing oxidation of the surface of the wafer 200.

Further, in a case where the thickness of the SiN film formed by performing step (a) is 5 to 500 Å, the processing temperature that may be selected in this step is, for example, 300 degrees C. or higher, and lower than 800 degrees C., as described above. In particular, in a case where the thickness of the SiN film is 5 to 50 Å, the processing temperature that may be selected in this step may be 300 degrees C. or higher, and lower than 600 degrees C., as described above.

In a case where the processing temperature is lower than 300 degrees C., it may be difficult to generate oxidizing species that is be used when oxidizing the SiN film. By setting the processing temperature to 300 degrees C. or higher, it is possible to generate sufficient oxidizing species to oxidize the SiN film to oxidize the entirety of the SiN film in its thickness direction.

In a case where the processing temperature is 800 degrees C. or higher, the processing time increases significantly before the oxidation reaction is saturated, making it difficult to saturate the oxidation reaction within a practical processing time. By setting the processing temperature to be lower than 800 degrees C., the oxidation reaction may be saturated within the practical processing time. For example, by setting the processing temperature to be lower than 800 degrees C., the rate at which the thickness of the oxide film increases may be saturated to 0.4 Å/min or less in a relatively short time, and an oxidation reaction of a thin SiN film of about 400 to 500 Å may be reliably saturated when the entirety of the SiN film is oxidized. Further, by setting the processing temperature to be lower than 600 degrees C., the oxidation reaction may be more clearly saturated within a practical processing time. For example, by setting the processing temperature to be lower than 600 degrees C., the rate at which the thickness of the oxide film increases may be saturated to 0.2 Å/min or less in a relatively short time, and an oxidation reaction of a thinner SiN film of about 5 to 50 Å may be reliably saturated when the entirety of the SiN film is oxidized.

After the conversion of the SiN film to the SiO film is completed, the valves **243*d* and 243*c* are closed to stop the supply of the O-containing gas and the H-containing gas into the process chamber 201**.

An oxygen ($O_2$) gas, a nitrous oxide ($N_2O$) gas, a nitric oxide (NO) gas, a nitrogen dioxide ($NO_2$) gas, an ozone ($O_3$) gas, a $H_2O$ gas, a carbon oxide (CO) gas, a carbon dioxide ($CO_2$) gas, and the like may be used as the O-containing gas. A hydrogen ($H_2$) gas and a deuterium ($D_2$) gas may be used as the H-containing gas.

(After-Purge and Returning to Atmospheric Pressure)

After the process of forming the SiO film with the desired thickness on the wafer 200 is completed, an inert gas as a purge gas is supplied into the process chamber 201 from each of the nozzles **249*a* and 249*b* and is exhausted via the exhaust port 231*a*. Thus, the inside of the process chamber 201 is purged and a gas or reaction by-products remaining in the process chamber 201 are removed from the process chamber 201 (after-purge). Thereafter, the atmosphere in the process chamber 201 is replaced with an inert gas (inert gas replacement) and the pressure in the process chamber 201** is returned to a normal pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter **219*s* is moved and the lower end opening of the manifold 209 is sealed by the shutter 219*s* via the O-ring 220*c* (shutter closing). The processed wafers 200 are unloaded to the outside of the reaction tube 203, and are then discharged from the boat 217** (wafer discharging).

(3) Effects of the Embodiments of the Present Disclosure

According to the embodiments of the present disclosure, one or more selected from the group of effects set forth below may be achieved.

(a) In step (b), as the processing temperature, different processing temperatures are selected depending on the thickness of the first element-containing nitride film (nitride film). In this way, in step (b), it is possible to easily control an oxidation rate of the nitride film formed on the wafer 200 by using the processing temperature, which is relatively easy to control, as a control parameter among various process conditions.

(b) In step (b), as the processing temperature, a temperature at which the entirety of the nitride film in the thickness direction of the nitride film is oxidized is selected depending on the thickness of the nitride film. By selecting such a temperature, it is possible to reliably oxidize the entirety of the nitride film in its thickness direction.

(c) In step (b), as the processing temperature, a temperature at which the entirety of the nitride film in the thickness direction of the nitride film is oxidized and the surface of the wafer 200 is not oxidized is selected depending on the thickness of the nitride film. The selection of such a temperature makes it possible to reliably suppress oxidation of the surface of the wafer 200 while reliably oxidizing the entirety of the nitride film in its thickness direction.

(d) In step (b), as the processing temperature, a temperature at which the oxidation reaction is saturated when the entirety of the nitride film in the thickness direction of the nitride film is oxidized is selected depending on the thickness of the nitride film. The selection of such a temperature makes it possible to reliably oxidize the entirety of the nitride film formed in step (a) in the thickness direction of the nitride film in the case where step (b) is continued at least until the oxidation reaction of the entirety of the nitride film is saturated. Further, even in a case where the processing time is exceeded after the entirety of the nitride film in its thickness direction is oxidized, it is possible to reliably suppress oxidation of the surface of the wafer 200. That is, by selecting such a temperature in step (b), it is possible to easily achieve the process of oxidizing the entirety of the nitride film without strictly controlling the processing time while suppressing oxidation of the surface of the wafer 200.

(e) In step (a), the film thickness of the SiN film is determined by calculating back from a target film thickness of the first element-containing oxide film (oxide film) to be formed in step (b), considering the expansion rate of the nitride film. As a result, an oxide film with a desired thickness may be formed on the wafer 200.

(f) Since step (a) is performed in an oxygen-free atmosphere, it is possible to suppress oxidation of the surface of the wafer 200. Further, in step (b), by selecting a temperature at which the entirety of the nitride film in the thickness direction of the nitride film is oxidized and the surface of the wafer 200 is not oxidized (for example, a temperature at which the oxidation reaction is saturated when the oxidation of the nitride film reaches entirety of the nitride film in its thickness direction is selected), it is possible to suppress the oxidation of the surface of the wafer 200 while reliably oxidizing the entirety of the nitride film in its thickness direction. Thus, the present disclosure is of great significance over the related art in that a very thin oxide film may be formed on the wafer 200 while avoiding oxidation of the surface of the wafer 200. Further, according to a method of alternately or simultaneously supplying, for example, a silane-based gas and an O-containing gas to the wafer 200 in the related art, it is difficult to form a SiO film as a very thin oxide film with a thickness of, for example, 8 to 800 Å on the wafer 200 while avoiding oxidation of the surface of the wafer 200.

(g) In step (a), by alternately supplying the first element-containing gas and the N-containing gas to the wafer 200, a nitride film excellent in step coverage, wafer (200) in-plane film thickness uniformity, inter-wafer (200) film thickness uniformity, film thickness controllability, and the like may be formed on the wafer 200. Therefore, similar to the nitride film, it is possible to make an oxide film, which is formed by oxidizing this nitride film, excellent in step coverage, wafer (200) in-plane film thickness uniformity, inter-wafer (200) film thickness uniformity, and film thickness controllability.

(h) In step (b), the nitride film formed on the wafer 200 is oxidized by using a strong oxidizing power of the oxidizing species such as atomic oxygen. As a result, it is possible to form a high-density and high-quality oxide film on the wafer 200 that is excellent in etching resistance and insulation.

(i) Since step (a) and step (b) are performed in the same process chamber 201 (in-situ), the processing time may be shortened as compared to performing these steps in different process chambers (ex-situ). Further, by doing so, it is possible to prevent a native oxide film (interface impurities) from being formed on the SiN film before execution of step (b).

(j) The above-described effects may be similarly obtained when using the above-described various first element-containing gases, N-containing gases, O-containing gases, H-containing gases, and inert gases.

Other Embodiments of the Present Disclosure

In the above-described embodiments, examples are described in which the nitride film is formed in step (a) and the nitride film is oxidized to form the oxide film in step (b). However, the present disclosure is not limited thereto. Another example of film formation processing sequence of forming an oxide film with a predetermined thickness on the wafer 200 of the embodiments of the present disclosure will be described mainly with reference to FIGS. 6 and 7A to 7C. In the embodiments, processing procedures and process conditions different from those in the above-described embodiments will be mainly described below, and the same processing procedures and process conditions will not be described.

A film formation processing sequence in the embodiments includes:

step c of forming a first element-containing film on a wafer 200 by supplying a first element-containing gas to the wafer 200 in a process chamber in an oxygen-free atmosphere; and step d of forming an oxide film by oxidizing the first element-containing film by supplying an oxygen-containing gas to the wafer 200, wherein in step d, different temperatures of the wafer 200 are selected depending on the thickness of the first element-containing film.

In the film formation processing sequence in the embodiments, in step c, a film composed of a first element (hereinafter sometimes simply referred to as a single element film) is formed as the first element-containing film by performing a cycle a predetermined number of times (n times, where n is an integer of 1 or more), the cycle including performing a step of supplying the first element-containing gas to the wafer 200.

Further, in the film formation processing sequence in the embodiments,

In step d, a first element-containing oxide film (hereinafter sometimes simply referred to as an oxide film) is formed by oxidizing the film composed of the first element by simultaneously supplying an O-containing gas and a H-containing gas to the wafer 200 in the process chamber 201 under a reduced pressure (under a pressure less than the atmospheric pressure).

In the present disclosure, for the sake of convenience, the above-described film formation processing sequence may be denoted as follows.

First element-containing gas×$n$→(O-containing gas+H-containing gas)

The wafer 200 is loaded into the process chamber 201 and the internal pressure and internal temperature of the process chamber 201 are regulated according to the same processing procedure as the above-described embodiments.

(Formation of Film composed of First Element)

Thereafter, a first element-containing gas is supplied to the wafer 200 in the process chamber 201 according to the same processing procedure as the above-described embodiments.

A process condition in this step is exemplified as follows.

First element-containing gas supply flow rate: 10 to 500 sccm, specifically 100 to 400 sccm Inert gas supply flow rate (for each gas supply pipe): 500 to 1,500 sccm Each gas supply time: 1 to 300 seconds, specifically 10 to 120 seconds Processing temperature (temperature of wafer 200): 300 to 550 degrees C., specifically 400 to 550 degrees C.

Processing pressure (internal pressure of process chamber 201): 10 to 13,300 Pa, specifically 300 to 1,330 Pa In this step, for example, when a chlorosilane-based gas, which is a Si-containing gas, is used as the first element-containing gas, a Si-containing layer as a first element-containing layer is formed on the wafer 200 in the same manner as in the above-described embodiments. Further, as the first element-containing gas, other first element-containing gases exemplified in the above-described embodiments may also be used.

After the Si-containing layer is formed, the supply of the first element-containing gas into the process chamber 201 is stopped according to the same processing procedure as the above-described embodiments. Then, the inside of the process chamber 201 is vacuum-exhausted to remove a gas and the like remaining in the process chamber 201 from the process chamber 201 according to the same procedure as the above-described embodiments (purging). Further, in the above-described embodiments, an inert gas is used as a purge gas used when removing a gas and the like remaining in the process chamber 201 from the process chamber 201, but a $H_2$ gas may be used as the purge gas instead of or together with the inert gas.

[Performing Cycle Predetermined Number of Times]

Figures 7A, 7B, 7C:
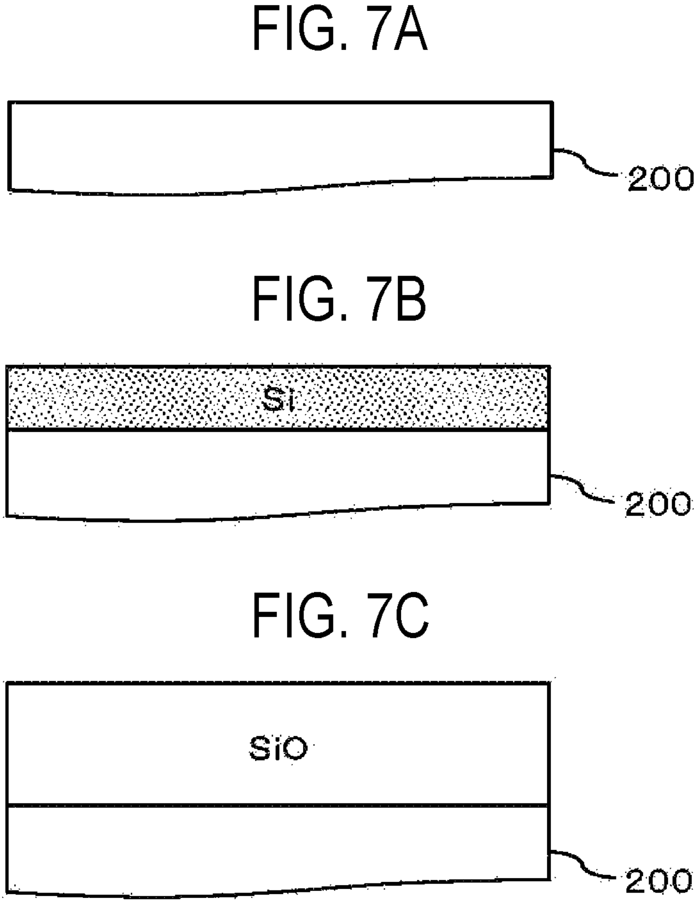
FIG. 7A is a partially enlarged cross-sectional view of the surface of the wafer before the film-forming process is performed.
FIG. 7B is a partially enlarged cross-sectional view of the surface of the wafer after a first element-containing film is formed on the wafer.
FIG. 7C is a partially enlarged cross-sectional view of the surface of the wafer after the first element-containing film formed on the wafer is oxidized to form an oxide film.

By performing a cycle a predetermined number of times (n times, where n is an integer of 1 or more), the cycle including performing the above-described steps, a Si film with a predetermined thickness may be formed on the surface of the wafer 200 as the base, as shown in FIG. 7B. Further, the Si film as the film composed of the first element formed in step c expands at a predetermined rate by being oxidized in step d, which is described below, to be converted into a SiO film as a first element-containing oxide film. In step c, considering this fact, that is, the expansion rate of the Si film, the film thickness of the Si film may be determined by calculating back from the target film thickness of the SiO film to be formed in step d.

After the process of forming the Si film with the desired thickness on the wafer 200 is completed, the APC valve 244 is regulated such that the internal pressure of the process chamber 201 becomes a predetermined pressure lower than the atmospheric pressure (pressure regulation). Further, the output of the heater 207 is regulated such that the temperature of the wafer 200 in the process chamber 201 becomes a predetermined temperature (temperature regulation).

(Formation of First Element-Containing Oxide Film)

Thereafter, an O-containing gas and a H-containing gas are supplied to the wafer 200 in the process chamber 201, that is, the Si film which is a first element-containing film composed of the first element formed on the wafer 200.

The same process condition as those in the step of forming the first element-containing oxide film of the above-described embodiments is exemplified as a process condition in this step.

By supplying the O-containing gas and the H-containing gas to the wafer 200 under the above-mentioned condition, the Si film, which is the film composed of the first element formed on the wafer 200, is converted into a SiO film which is a first element-containing oxide film, as shown in FIG. 7C.

Further, when the Si film is oxidized to be converted into the SiO film under the above-mentioned condition, the Si film expands at a predetermined rate (expansion rate) by introducing O during the oxidation. Therefore, the SiO film formed by performing step d becomes a film with a larger film thickness than the Si film before the oxidation (the Si film formed by performing step c). For example, when the thickness of the Si film formed by performing step c is 5 to 500 Å, the thickness of the SiO film formed by performing step d under the above-mentioned process condition becomes a thickness multiplied by its expansion ratio (about 2), that is, a thickness of about 10 to 1,000 Å.

Further, when the thickness of the Si film formed by performing step c is 5 to 500 Å, the processing temperature that may be selected in this step is, for example, 300 degrees C. or higher, and lower than 800 degrees C., as described above. In particular, when the thickness of the Si film is 5 to 50 Å, the processing temperature that may be selected in this step may be 300 degrees C. or higher and lower than 600 degrees C., as described above.

After the conversion of the Si film into the SiO film is completed, the supply of the O-containing gas and the H-containing gas into the process chamber 201 is stopped according to the same processing procedure as the above-described embodiments.

After the process of forming the SiO film with the desired thickness on the wafer 200 is completed, a gas and reaction by-products remaining in the process chamber 201 are removed from the process chamber 201 according to the same processing procedure as the above-described embodiments, and the processed wafers 200 are unloaded out of the reaction tube 203.

These t embodiments may also obtain the same effects as the above-described embodiments.

Other Embodiments of the Present Disclosure

The embodiments of the present disclosure are specifically described above. However, the present disclosure is not limited to the above-described embodiments, and may be modified in various ways without departing from the gist of the present disclosure.

In the above-described embodiments of the present disclosure, in step (b), the example in which the entirety of N contained in the nitride film is desorbed from the film to convert the nitride film into the oxide film is described, but the present disclosure is not limited thereto. For example, in step (b), an oxynitride film (for example, a silicon oxynitride film (SiON film)) may be formed by leaving a predetermined ratio of N contained in the nitride film. Even in this way, the same effects as the above-described embodiments may be obtained.

Further, in the above-described embodiments, for example, the example in which the nitride film is formed in step (a) and the oxide film is formed by oxidizing the nitride film in step (b) is described, but the present disclosure is not limited thereto. For example, in step (a), a carbide film (for example, a silicon carbide film (SiC film)) may be formed on the wafer 200, and in step (b), the carbide film may be oxidized to form an oxycarbide film (for example, a silicon oxycarbide film (SiOC film)). Further, in step (a), a carbonitride film (for example, a silicon carbonitride film (SiCN film)) may be formed, and in step (b), the carbonitride film may be oxidized to form an oxycarbonitride film (for example, a silicon oxycarbonitride film (SiOCN film)). Even in this way, the same effects as the above-described embodiments may be obtained.

Further, the present disclosure is also suitably applicable to a case of forming an oxide film containing metal elements such as aluminum (Al), hafnium (Hf), zirconium (Zr), and titanium (Ti), that is, a metal-based oxide film, on the wafer 200. That is, the present disclosure is also suitably applicable to a case of forming an aluminum oxide film (AlO film), a hafnium oxide film (HfO film), a zirconium oxide film (ZrO film), a titanium oxide film (TiO film), and the like on the wafer 200. Even in such a case, the same effects as the above-described embodiments may be obtained.

Further, in the above-described embodiments, an example in which the O-containing gas and the H-containing gas are simultaneously supplied as the oxidizing gases to the wafer 200 in step (b) is described, but the present disclosure is not limited thereto. For example, in step (b), first element-containing films such as the first element-containing nitride film and the film composed of the first element may be oxidized by supplying the O-containing gas alone without supplying the H-containing gas to the wafer 200. Alternatively, the oxidation may be performed by using active species containing O obtained by plasma-exciting the O-containing gas. However, from the viewpoint that the oxidation process may be performed with a strong oxidizing power, the O-containing gas and the H-containing gas may be simultaneously supplied to the wafer 200 as in the above-described embodiments.

Recipes used in each process may be provided individually according to the processing contents and may be stored in the memory 121*c* via a telecommunication line or the external memory 123. Further, at the beginning of each process, the CPU 121*a* may properly select an appropriate recipe from a plurality of recipes stored in the memory 121*c* according to contents of the process. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by changing existing recipes that are already installed in the substrate processing apparatus. Once the recipes are changed, the changed recipes may be installed in the substrate processing apparatus via a telecommunication line or a recording medium storing the recipes. Further, the existing recipes already installed in the existing substrate processing apparatus may be directly changed by operating the input/output device 122 of the substrate processing apparatus.

An example in which a film is formed by using a batch-type substrate processing apparatus capable of processing a plurality of substrates at a time is described in the above-described embodiments. The present disclosure is not limited to the above-described embodiments, but may be suitably applied, for example, to a case where a film is formed by using a single-wafer type substrate processing apparatus capable of processing a single substrate or several substrates at a time. Further, an example in which a film is formed by using a substrate processing apparatus including a hot-wall-type process furnace is described in the above-described embodiments. The present disclosure is not limited to the above-described embodiments, but may be suitably applied to a case where a film is formed by using a substrate processing apparatus including a cold-wall-type process furnace.

Even in a case where these substrate processing apparatuses are used, each process may be performed according to the same processing procedures and process conditions as those in the above-described embodiments, and the same effects as the above-described embodiments are achieved.

The above-described embodiments may be used in proper combination. Processing procedures and process conditions used in this case may be the same as, for example, the processing procedures and process conditions in the above-described embodiments.

EXAMPLES

Figure 8:
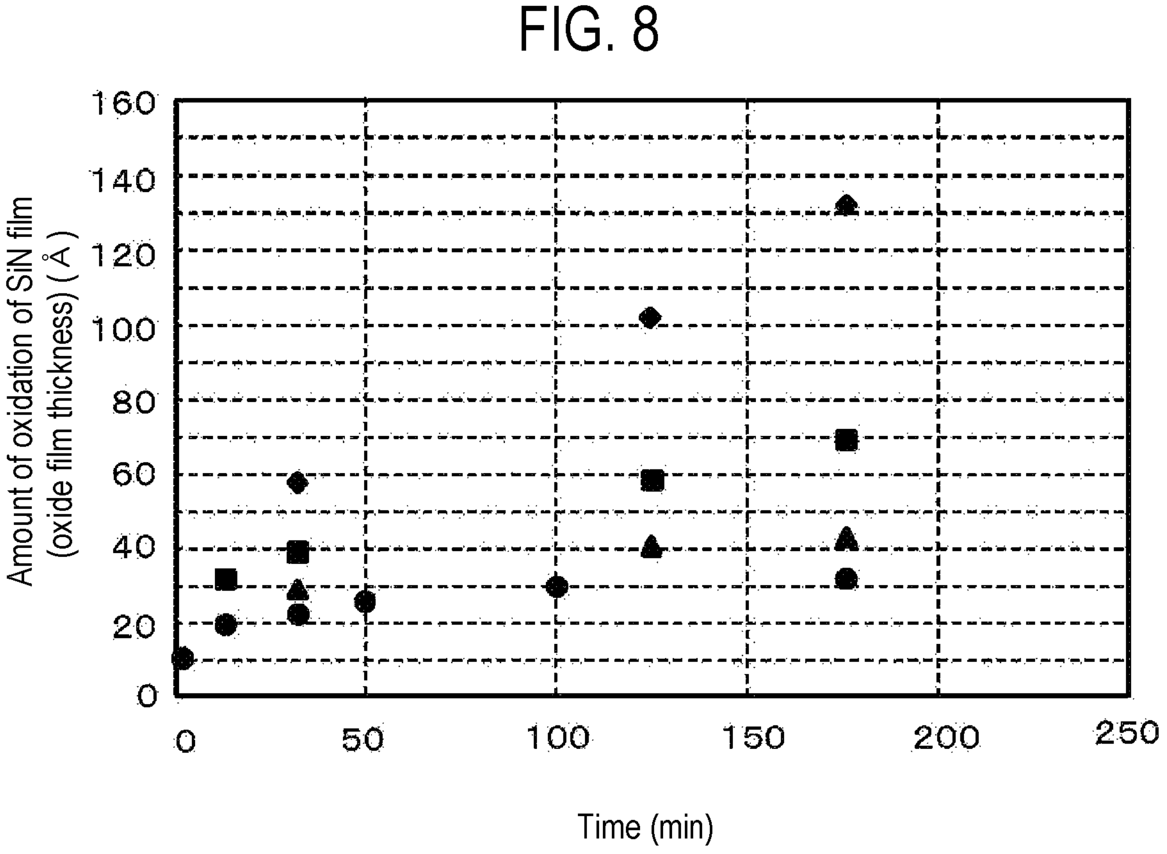
FIG. 8 is a diagram showing the relationship between a supply time of an O-containing gas and a H-containing gas and an oxidation amount of a nitride film during a predetermined gas supply time for each processing temperature in an Example.

As an Example, by using the substrate processing apparatus shown in FIG. 1, according to the same processing procedure and process condition as the substrate processing in the above-described embodiments, a SiN film is formed on a wafer in step (a), and a SiO film as an oxide film is formed by oxidizing the SiN film in step (b). When forming the SiO film, an amount of oxidation (oxide film thickness) of the SiN film is measured at a plurality of predetermined timings. The results are shown in FIG. 8. Further, in step (a), a HCDS gas is used as a chlorosilane-based gas, which is a first element-containing gas, and a $NH_3$ gas is used as a N-containing gas, and in step (b), an $O_2$ gas is used as an O-containing gas, and a $H_2$ gas is used as a H-containing gas.

FIG. 8 illustrates a relationship between a time during which an $O_2$ gas and a $H_2$ gas are supplied (hereinafter, sometimes simply referred to as a "supply time") to the wafer on which the SiN film is formed and an amount of oxidation (oxide film thickness) of the SiN film during the supply time is illustrated for each processing temperature. The horizontal axis of FIG. 8 indicates the supply time in [min]. The vertical axis of FIG. 8 indicates the amount of oxidation (oxide film thickness) of the SiN film in [Å].

In FIG. 8, ● indicates the amount of oxidation of the SiN film for a predetermined supply time when a processing temperature is 400 degrees C. ▲ indicates the amount of oxidation of the SiN film for the predetermined supply time when the processing temperature is 500 degrees C. ■ indicates the amount of oxidation of the SiN film for the predetermined supply time when the processing temperature is 600 degree C. ♦ indicates the amount of oxidation of the SiN film for the predetermined supply time when the processing temperature is 700 degrees C.

Specifically, for example, when the processing temperature is 400 degrees C., the amount of oxidation of the SiN film reaches about 30 Å when the supply time reaches around 100 min. The amount of oxidation of the SiN film is about 32 Å when the supply time is around 175 min. Therefore, the oxide film thickness of the SiN film per unit time for the supply time of 100 to 175 min is (32−30)Å/(175−100)min≈0.027 Å/min, which is 0.4 Å/min or less. Therefore, it may be considered that the oxidation reaction is saturated when the supply time reaches around 100 min. Therefore, the processing temperature of 400° C. may be selected when oxidizing the SiN film with a thickness of 30 Å. By selecting 400 degrees C., when the supply time reaches around 100 min, the entirety of the SiN film in a thickness direction of the SiN film may be oxidized and the oxidation reaction is saturated, making it possible to suppress oxidation of the wafer without strict control of the supply time. Further, in this way, since a sufficient supply time may be obtained, the SiO film may be uniformly formed over the entire surface of the wafer.

Further, for example, when the processing temperature is 500 degrees C., the amount of oxidation of the SiN film reaches about 40 Å when the supply time reaches around 125 min. The amount of oxidation of the SiN film is about 42 Å when the supply time is around 175 min. Therefore, the oxide film thickness of the SiN film per unit time for the supply time of 175 to 125 min is (42−40)Å/(175−125) min≈0.04 Å/min, which is 0.4 Å/min or less. Therefore, it may be considered that the oxidation reaction is saturated when the supply time reaches around 125 min. Therefore, the processing temperature of 500° C. may be selected when oxidizing the SiN film with a thickness of 40 Å. By selecting 500 degrees C., when the supply time reaches around 125 min, the entirety of the SiN film in its thickness direction may be oxidized and the oxidation reaction is saturated, making it possible to suppress oxidation of the wafer without strict control of the supply time. Further, in this way, since a sufficient supply time may be obtained, the SiO film may be uniformly formed over the entire surface of the wafer.

Further, for example, when the processing temperature is 600 degrees C., the amount of oxidation of the SiN film reaches about 60 Å when the supply time reaches around 125 min. The amount of oxidation of the SiN film is about 70 Å when the supply time is around 175 min. Therefore, the oxide film thickness of the SiN film per unit time for the supply time of 175 to 125 min is (70−60)Å/(175−125) min≈0.2 Å/min, which is 0.4 Å/min or less. Therefore, it may be considered that the oxidation reaction is saturated when the supply time reaches around 125 min. Therefore, the processing temperature of 600° C. may be selected when oxidizing the SiN film with a thickness of 60 Å. By selecting 600 degrees C., when the supply time reaches around 125 min, the entirety of the SiN film in its thickness direction may be oxidized and the oxidation reaction is saturated, making it possible to suppress oxidation of the wafer without strict control of the supply time. Further, in this way, since a sufficient supply time may be obtained, the SiO film may be uniformly formed over the entire surface of the wafer.

Further, for example, when the processing temperature is 700 degrees C., the amount of oxidation of the SiN film reaches about 100 Å when the supply time reaches around 125 min. The amount of oxidation of the SiN film is about 132 Å when the supply time is around 175 min. Therefore, the oxide film thickness of the SiN film per unit time for the supply time of 175 to 125 min is (132−100)Å/(175−125) min≈0.64 Å/min, which is 0.4 Å/min or more. Therefore, when oxidizing a SiN film with a thickness of 100 Å, a temperature of lower than 700 degrees C. and higher than 600 degrees C. may be selected as the processing temperature.

According to the present disclosure, it is possible to enhance an effect of suppressing oxidation of a base when forming an oxide film on the base.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) forming a first element-containing film on the substrate by supplying a first element-containing gas to the substrate in an oxygen-free atmosphere; and (b) forming an oxide film by oxidizing the first element-containing film without an oxidized surface at a processing temperature of the substrate by supplying an oxygen-containing gas to the substrate, wherein in (b), the processing temperature of the substrate is selected depending on a thickness of the first element-containing film.

2. The method of claim 1, wherein in (b), a temperature of the substrate at which the first element-containing film is entirely oxidized in a thickness direction of the first element-containing film is selected as the processing temperature of the substrate.

3. The method of claim 1, wherein in (b), a temperature of the substrate at which the first element-containing film is entirely oxidized in a thickness direction of the first element-containing film and an interface between the substrate and the first element-containing film is not oxidized is selected as the processing temperature of the substrate.

4. The method of claim 1, wherein in (b), a temperature of the substrate at which an oxidation reaction of the first element-containing film is saturated when oxidation of the first element-containing film reaches an entire thickness of the first element-containing film is selected as the processing temperature of the substrate.

5. The method of claim 4, wherein (b) is continued until the oxidation reaction of an entirety of the first element-containing film is saturated.

6. The method of claim 1, wherein (b) is continued until an increasing rate of a thickness of the oxide film of the first element-containing film per unit time falls to 0.4 Å/min or less.

7. The method of claim 1, wherein the thickness of the first element-containing film in (a) is determined such that the oxide film formed by expanding the first element-containing film by oxidation in (b) is formed with a desired thickness.

8. The method of claim 1, wherein in (a), the first element-containing film is formed on a surface of the substrate where no oxide film is formed.

9. The method of claim 1, wherein in (a), a gas in which the first element is silicon is used as the first element-containing gas.

10. The method of claim 9, wherein in (a), a silicon nitride film is formed as the first element-containing film.

11. The method of claim 9, wherein in (a), a silicon film is formed as the first element-containing film.

12. The method of claim 11, wherein in (b), a silicon oxide film is formed as the oxide film.

13. The method of claim 10, wherein in (b), a silicon oxynitride film is formed as the oxide film.

14. The method of claim 9, wherein in (a), a silicon carbide film or a silicon carbonitride film is formed as the first element-containing film.

15. The method of claim 14, wherein in (b), a silicon oxycarbide film or a silicon oxycarbonitride film is formed as the oxide film.

16. The method of claim 1, wherein in (b), the oxygen-containing gas and a hydrogen-containing gas are supplied to the substrate under a reduced pressure.

17. A method of manufacturing a semiconductor device comprising the method of claim 1.

18. The method of claim 1, wherein a temperature of the substrate depending on the thickness of the first element-containing film is selected as the processing temperature of the substrate in (b).

19. The method of claim 1, wherein the processing temperature of the substrate selected in (b) increases with the thickness of the first element-containing film.

20. A substrate processing apparatus comprising:

a first gas supplier configured to supply a first element-containing gas to a substrate;

a second gas supplier configured to supply an oxygen-containing gas to the substrate; and a controller configured to be capable of controlling the first gas supplier and the second gas supplier to perform a process to the substrate, the process including:

(a) forming a first element-containing film on the substrate by supplying the first element-containing gas to the substrate in an oxygen-free atmosphere; and (b) forming an oxide film by oxidizing the first element-containing film without an oxidized surface at a processing temperature of the substrate by supplying the oxygen-containing gas to the substrate, wherein in (b), the processing temperature of the substrate is selected depending on a thickness of the first element-containing film.

21. A non-transitory computer-readable recording medium storing a program that causes, by a computer, a substrate processing apparatus to perform a process comprising:

(a) forming a first element-containing film on a substrate by supplying a first element-containing gas to the substrate in an oxygen-free atmosphere; and (b) forming an oxide film by oxidizing the first element-containing film without an oxidized surface at a processing temperature of the substrate by supplying an oxygen-containing gas to the substrate, wherein in (b), the processing temperature of the substrate is selected depending on a thickness of the first element-containing film.

* * * * *